United States Patent [19]

Asai et al.

[11] Patent Number: 4,660,280
[45] Date of Patent: Apr. 28, 1987

[54] APPARATUS FOR CONVEYING AND POSITIONING CIRCUIT SUBSTRATES OF PRINTED-WIRING BOARDS

[75] Inventors: Koichi Asai, Nagoya; Mamoru Tsuda, Okazaki; Jiro Kodama, Nagoya, all of Japan

[73] Assignee: Fuji Machine Mfg. Co., Ltd., Aichi, Japan

[21] Appl. No.: 819,022

[22] Filed: Jan. 15, 1986

[30] Foreign Application Priority Data

Jan. 21, 1985 [JP] Japan .................................. 60-8808

[51] Int. Cl.[4] .............................................. H05K 3/30
[52] U.S. Cl. ........................................ 29/759; 29/741; 198/345; 198/836; 198/861.1
[58] Field of Search ................. 29/740, 741, 759, 760; 198/345, 861.1, 836, 339.1

[56] References Cited

U.S. PATENT DOCUMENTS 3,854,688 12/1974 Shuford .......................... 198/836 X
3,874,497 4/1975 Carlson ............................... 198/836

Primary Examiner—Carl E. Hall
Attorney, Agent, or Firm—Parkhurst & Oliff

[57] ABSTRACT

An apparatus for conveying and positioning a substrate of a printed-wiring board, comprising: a conveyor system for transferring the substrate, including a pair of parallel spaced-apart side frames at least one of which is movable relative to the other; a positioning device including a support member, a pair of parallel spaced-apart holder members disposed on the support member and movable relative to each other so as to be engageable with opposite sides of the substrate parallel to the side frames, to thereby hold the substrate, and a device for moving the support member along X and Y axes, so as to position the substrate within a predetermined area; a device for moving the support member between an aligned position in which the holder members are aligned with the side frames, and an unaligned position for positioning the substrate in the predetermined area; and a device for connecting the movable holder member and the movable side frame when the support member is in the aligned position. The distance between the holder members is variable with a change in the distance between the side frames.

11 Claims, 17 Drawing Figures

APPARATUS FOR CONVEYING AND POSITIONING CIRCUIT SUBSTRATES OF PRINTED-WIRING BOARDS

BACKGROUND OF THE INVENTION

1. Field of the Art

The present invention relates generally to an apparatus comprising a conveyer system for transferring circuit substrates of printed-circuit boards, and a substrate positioning device for positioning the circuit substrates at predetermined positions. More particularly, the invention relates to such a conveying and positioning apparatus which is capable of handling the circuit substrates of different sizes of the printed-wiring boards.

2. Related Art Statement

In the art of manufacturing printed-wiring boards, circuit substrates of the boards are generally transferred by a suitable conveyer system successively to a substrate positioning device designed to position each of the received substrates at predetermined positions at which holes are drilled in the substrate, or at which electronic circuit components are placed on the substrate. Such an apparatus for conveying and positioning the substrates is also used for inspecting the printed-wiring boards after the placement of the electronic components thereon, or for performing other operations on the substrates in an automatic fashion.

The conveyer system functions to load the positioning device with the substrates, and to unload the positioning device after the substrates have been processed on the positioning device. An example of such a conveyer system includes a pair of parallel side frames which are spaced from each other and at least one of which is movable toward and away the other. The substrates of a printed-wiring board are transferred to and from the positioning device while being guided by the side frames. In this type of conveyer system, the distance between the parallel spaced-apart side frames can be changed by moving the movable side frame relative to the other, whereby the conveyer system is capable of handling the circuit substrates of printed-wiring boards having different sizes.

An example of the substrate positioning device comprises a mounting or support member which is moved by a driving device along an X axis parallel to the spaced-apart side frames of the conveyer system, and a Y axis perpendicular to the X axis. The support member supports a pair of holder members for supporting the substrate. The holder members extend in the X-axis direction, and at least one of the holder members is movable in the Y-axis direction toward and away from the other, so that the two spaced-apart holder members are engageable with opposite sides of the substrate parallel to the X axis, to thereby position and hold the substrate in the Y-axis direction. Thus, like the above-indicated conveyer system, the distance between the holder members can be adjusted to suit the specific size of the substrate to be positioned, by moving the holder members toward or away from each other in the Y-axis direction.

3. Problems Solved By the Invention

However, the above-indicated conveyer system and substrate positioning device are designed independently of each other, in respect of the arrangements for changing the distance between the side frames and the distance between the substrate holder members. That is, the distance changing arrangements of the conveyer system and the positioning device are not interconnected, and must be operated separately from each other. Hence, considerable time is required to adjust the above-indicated distances of the conveyer system and the positioning device. Further, large efforts are needed if the adjustments of the distances are made manually by the operator. If a suitable mechanism such as a screw-and-nut arrangement is employed for adjusting the distance, such a mechanism is needed for both the side frames of the conveyer system and the holder members of the positioning device. Consequently, the conveyer and positioning apparatus is complicated, and the cost of manufacture is accordingly increased.

SUMMARY OF THE INVENTION

It is accordingly an object of the present invention to provide an apparatus which comprises a conveyer system for transferring circuit substrates of different sizes of printed-wiring boards, and a substrate positioning device for positioning the substrates which have been received from or are to be transferred to the conveyer system, and wherein a simple arrangement is provided for simultaneously changing a distance between a pair of side frames of the conveyer system, and a distance between a pair of substrate holder members of the positioning device.

According to the present invention, there is provided an apparatus for conveying and positioning a circuit substrate of a printed-wiring board, comprising a conveyer system including a pair of parallel side frames extending along an X axis and spaced apart from each other along a Y axis perpendicular to the X axis, at least one of which is movable relative to the other along the Y axis, distance-changing means for changing a distance between the pair of side frames by moving the at least one movable side frame along the Y axis, and conveyer means for transferring the substrate along the side frames. The apparatus further comprises a substrate positioning device including a support member, a pair of parallel spaced-apart holder members which are disposed on the support member and at least one of which is movable relative to the other along the Y axis so that the holder members are engageable with opposite sides of the substrate parallel to the X axis to thereby position and hold the substrate in the Y-axis direction, and first moving means for moving the support member in an X-Y plane including the X and Y axes, so as to position the substrate at desired positions within a predetermined substrate-positioning area in the X-Y plane. The apparatus further comprises second moving means for moving the support member between its aligned and unaligned positions, and a connecting device for connecting the above-indicated at least one movable holder member and the above-indicated at least one movable side frame. The aligned position of the support member is defined as a position in which the holder members are aligned with the respective side frames of the conveyer system in the Y-axis direction. The unaligned position of the support member is determined so that the holder members are spaced from the side frames in a given direction, in order to permit the substrate held by the holder members to be positioned in the predetermined substrate-positioning area indicated above. The connecting device is adapted to connect the movable holder and the movable side frame when the support member is placed in the aligned position. In this condition, a change in the distance between the side frames by the distance-changing means causes a change in a distance between the holder members in the Y-axis direction.

In the apparatus of the present invention constructed as described above, the support member is moved by the first moving means to its aligned position so that the at least one movable holder member of the substrate positioning device and the at least one movable side frame of the conveyer system are connected to each other by the connecting device. In this condition, the distance between the holder members can be changed, simultaneously when the distance between the side frames is changed by the distance-changing means to suit the specific Y-axis dimension of the substrate.

In the instant apparatus wherein the distance between the side frames and the distance between the holder members can be simultaneously changed as described above, the time and efforts required for changing the distances are reduced to almost one half of those required in a conventional apparatus in which the adjusting operation should be accomplished for each of the conveyer system and the substrate positioning device. Further, the instant apparatus is simple in construction and available at a reduced cost, since the single distance-changing means serve to change the distances of the conveyer system and the positioning device.

The conveyer system is not limited to a loading or unloading system disposed on only one of opposite sides of the positioning device along the X axis, i.e., only on the loading or unloading side of the positioning device. Instead, the apparatus may be constructed, according to an advantageous embodiment of the invention, such that the conveyer system comprises a feed-in or loading device and a feed-out or unloading device which are disposed on both sides of the substrate positioning device. In this case, the connecting device comprises a first connector for connecting an end of the feed-in device and the corresponding one end of the at least one movable holder member, and a second connector for connecting an end of the feed-out device and the other end of the at least one movable holder member.

The side frames which are movable relative to each other should be normally fixed relative to each other in the Y-axis direction. This fixed condition of the movable side frame or frames may be established through engagement thereof with the distance-changing means, or by applying a friction force between the side frame or frames and a stationary member other than the distance-changing means, which friction force is determined so as to permit movements of the movable frame or frames by the distance-changing means, but inhibit movements of the same on other occasions. Alternatively, the movable side frame or frames may be positively clamped in position, by a positive clamp mechanism. In this case, the side frame or frames must be unclamped automatically or manually before the distance between the side frames is changed. Similarly, the holder members of the positioning device should be normally fixed relative to each other. This may be accomplished by application of a friction force, or by a positive clamp mechanism, as indicated above in connection with the side frames of the conveyer system.

According to another advantageous embodiment of the invention, the connecting device comprises a first connecting member provided at one end of the at least one movable holder member adjacent to the at least one side frame, and a second connecting member provided at one end of the at least one movable side frame corresponding to the above-indicated one end of the at least one movable holder member. In this case, the first and second connecting members engage each other when the support member is placed in the aligned position. In one preferred form of this advantageous embodiment, the apparatus further comprises a clamp mechanism associated with the first connecting member and operable between a clamp position in which the at least one movable holder is clamped to the support member, and an unclamp position in which the at least one movable holder member is unclamped. The clamp mechanism is normally placed in the clamp position. In this preferred form, the apparatus further comprises an unclamping member provided at the above-identified one end of the at least one movable side frame. This unclamping member is engageable with the clap mechanism to bring the clamp mechanism to its unclamp position when the support member is moved to the aligned position by the second moving means previously indicated.

In the above-described preferred form of the invention wherein the clamp mechanism is provided, the unclamping member engages the clamp mechanism to unclamp the at least one movable holder member from the support member, when the support member is moved to its aligned position to connect the first and second connecting members. In this unclamp position of the clamp mechanism, the distance-changing means is activated to move the at least one movable holder member of the substrate positioning device, as well as the at least one movable side frame which has been connected to the at least one movable holder member, whereby not only the distance between the side frames but also the distance between the holder members can be adjusted to suit the size of the substrate. After this adjustment is completed, the support member is moved back to its unaligned position, in order to disconnect the first and second connecting members, and to disengage the unclamping member from the clamp mechanism to bring the clamp mechanism back to its clamp position. Thus, the at least one movable holder member is fixed to the support member.

In the thus constructed apparatus, the clamp mechanism firmly clamps the at least one movable holder member after the movement of the latter relative to the support member, thereby avoiding reduction in positioning accuracy of the substrate due to otherwise possible displacements of the movable holder member or members relative to the support plate. Of course, the instant apparatus provides the previously described advantages, that is, reduced time and efforts for changing the distances between the side frames and between the holder members, and reduced cost of manufacture for the arrangement to effect the changes of the distances. Further, the clamp mechanism is automatically brought into its unclamp position by the unclamping member when the support member is moved to its aligned position for moving the movable holder member or members relative to the support member to change the distance between the holder members. Namely, it is not necessary to manually unclamp the clamp mechanism before the holder members are moved relative to each other. Furthermore, the movement of the support member to the aligned position will cause the first and second connecting members to eangage each other, thereby permitting automatic connection of the movable holder member or members and the movable side frame or frames and thus eliminating manual connection of these components.

In the case where the clamp mechanism is provided, it is not always necessary to provide an unclamping member for the sole purpose of operating the clamp mechanism to its unclamp position. Namely, the second connecting member may be adapted to serve also as the unclamping member. In this instance, the apparatus may be further simplified.

BRIEF DESCRIPTION OF THE DRAWINGS

The above and optional objects, features and advantages of the present invention will be better understood from reading the following detailed description of a preferred embodiment of the invention, when considered in conjunction with the accompanying drawings, in which.

DETAILED DESCRIPTION OF THE PREFERRED EMBODIMENT

To further clarify the concept of the present invention, a preferred embodiment of the invention will be described, referring to the accompanying drawings.

Figure 1:
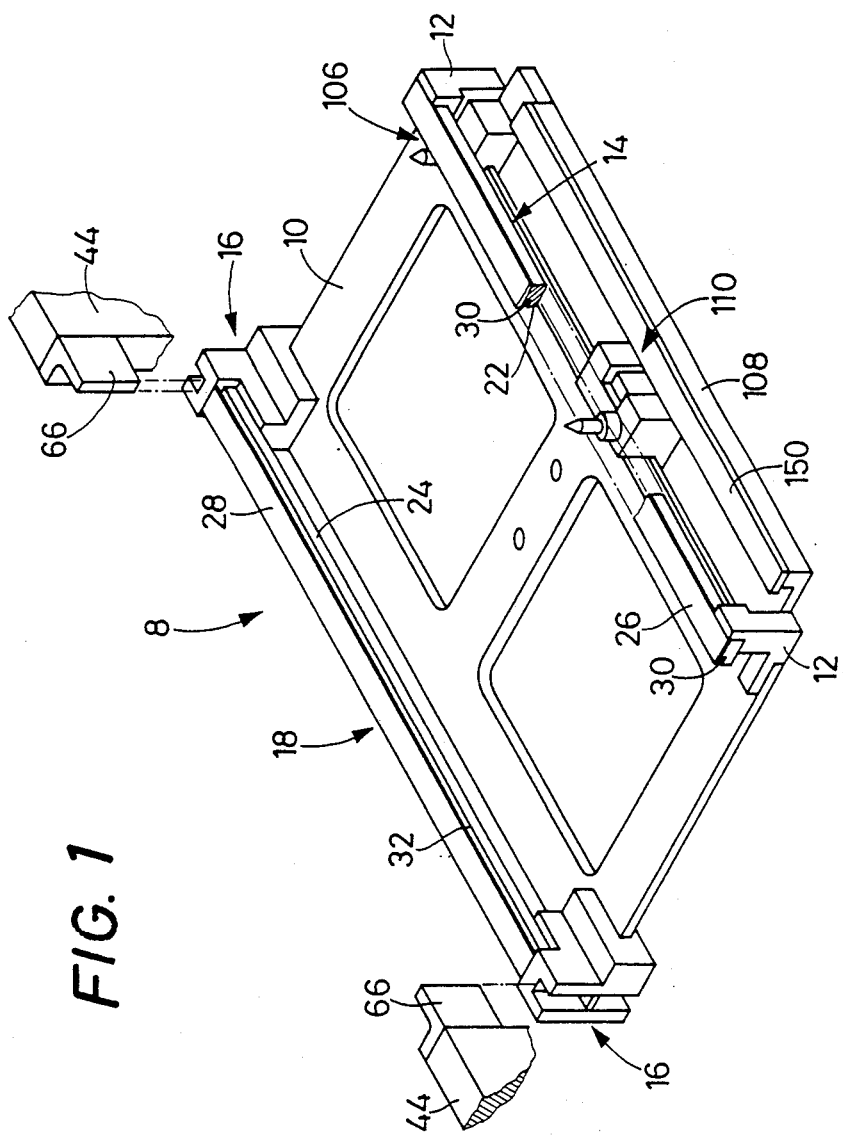
FIG. 1 is an illustrative fragmentary view in perspective of one embodiment of a substrate conveying and positioning apparatus of the present invention.

Referring first to an illustrative fragmentary perspective view of FIG. 1, there is shown an apparatus for conveying and positioning a circuit substrate 20 of a printed-wiring board. This apparatus is illustrated in greater detail in a plan view of FIG. 2, a fragmentary rear elevational view of FIG. 3, and a cross sectional view taken along line VI—VI of FIG. 2. In these figures, reference numeral 8 generally designates a substrate positioning device which comprises a support member 8 in the form of a rectangular support plate which supports a pair of stationary bracket 12, 12 and a pair of movable brackets 16, 16. The stationary brackets 12, 12 are fixed to the front left and right corners of the rectangular support plate 10, and supports a stationary guide 14 attached thereto. The movable brackets 16, 16 slidably engage the left and right sides of the support plate 10, and support a movable guide 18 fixed thereto. Thus, the movable brackets 16, 16 and the movable guide 18 are movable along a Y axis toward and away from the stationary brackets 12, 12 and the stationary guide 14, whereby the stationary and movable guides 14, 18 are engageable with the opposite front and rear sides of the support plate 10 parallel to an X axis perpendicular to the Y axis. Thus, the stationary guide 14 constitutes a stationary holder member while the movable guide 18 constitutes a movable holder member. That is, the stationary and movable holder members form a pair of holder members for positioning and holding the substrate 20 in the Y-axis direction. The stationary and movable guides 14, 18 serve to guide the substrate 20 in the X-axis direction (left and right directions in FIG. 2). The stationary guide 14 consists of an elongate guide bar 22 which has a rectangular shape in transverse cross section and extends parallel to the X axis, and a retainer plate 24 attached to the top surface of the guide bar 22. Similarly, the movable guide 18 consists of an elongate guide bar 24 and a retainer plate 28 parallel to the guide bar 22.

The guide bars 22, 24 are attached at their opposite ends to the top surfaces of the corresponding stationary and movable brackets 12, 12, 16, 16, so that the guide bars 22, 24 are located a suitable distance above the top surface of the support plate 10. The opposed side surfaces of the guide bars 22, 24 have a pair of opposed cutouts 30, 32 at their upper parts. These cutouts 30, 32 cooperate with the retainer plates 26, 28 respectively, to define a pair of guide grooves which are engageable with the front and rear sides of the substrate 20 parallel to the X axis. Since the stationary and movable guides 14, 18 in this specific embodiment are adapted to permit the substrate 20 to be slidably moved in the X-axis direction, the substate 20 is positioned roughly in the Y-axis direction.

Figure 2:
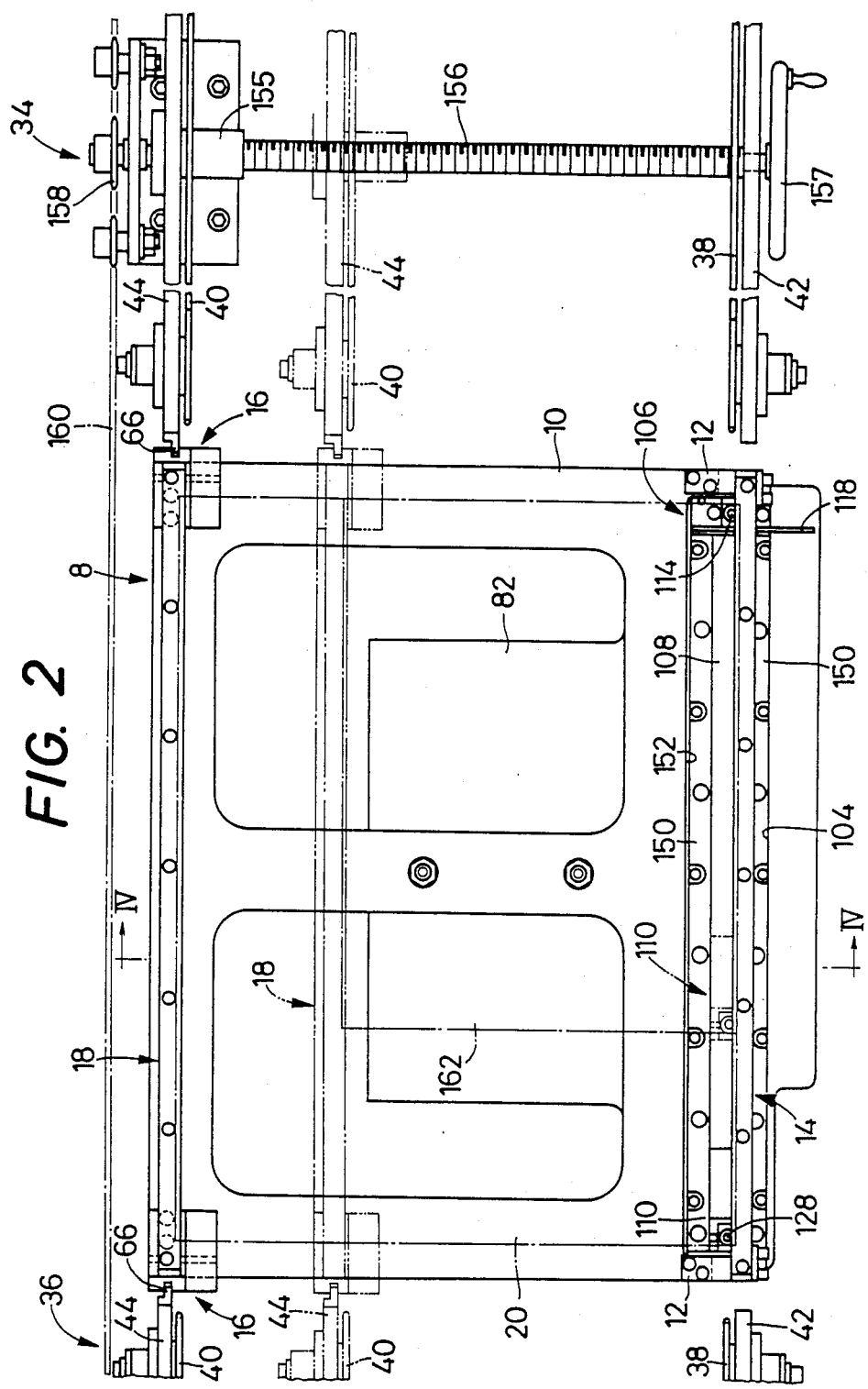
FIG. 2 is a plan view of the apparatus of FIG. 1.
Figure 3:
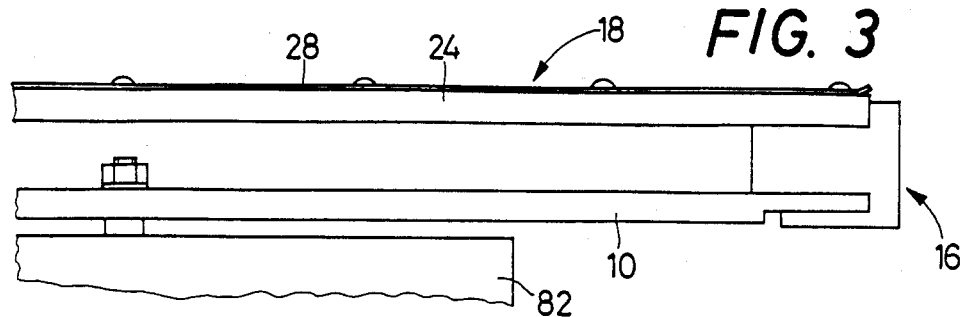
FIG. 3 is a fragmentary rear elevational view of the apparatus.

On the right and left sides of the support plate 10, there are disposed a feed-in device 34 and a feed-out device 36 for feeding the substrate 20 along the X axis toward and away from the support plate 10. Each of the feed-in and feed-out devices 34, 36, which constitute a conveyer system for conveying the substrate 20, has a pair of parallel conveyer belts 38, 40 which extend along the X axis and are spaced from each other along the Y axis. The feed-in and feed-out devices 34, 36 further have a pair of parallel spaced-apart guide plates 42, 44 which extend along the conveyer belts 38, 40 to serve as a pair of side frames of the conveyer system. The substrate 20 on the conveyer belts 38, 40 is moved while being guided by the guide plates 42, 44, from the right to the left as seen in FIG. 2, so that the substrate 20 is introduced onto the substrate positioning device 8 by the feed-in device 34, and removed from the positioning device 8 by the feed-out device 36. More specifically, the substrate 20 which has been conveyed to the feed-in end of the feed-in device 34 is slidably moved on the conveyer belts 38, 40 by a loader (not shown) and pushed in between the previously described stationary and movable guides 14, 18. This loader has a pusher which is reciprocated by a cylinder or a feed screw. In the meantime, the substrate 20 supported by the guides 14, 18 is slidably moved between the guides 14, 18 by an unloader (not shown), and pulled onto the conveyer belts 38, 40 of the feed-out device 36. This unloader has a puller which is adapted to hold the substrate 20 and reciprocated by a cylinder or a feed screw.

Figure 5:
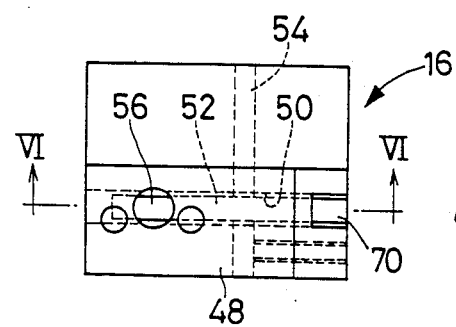
FIG. 5 is a plan view showing one of the movable brackets used in a substrate positioning device of the apparatus.

The movable brackets 16, 16 are constructed and disposed in exact symmetric relation with each other with respect to the Y axis. For this reason, only the movable bracket 16 provided on the left side of the support plate 10 will be described in detail referring to FIGS. 5 and 6, and no detailed description of the right bracket 16 will be given.

The left movable bracket 16 has in its lower portion a rectangular groove 46, so that the left-hand side end portion of the support plate 10 slidably engages the rectangular groove 46, so as to support the movable bracket 16 along the left side edge of the support plate 10, that is, in the Y-axis direction (perpendicular to the X axis), i.e., in the vertical direction of FIG. 2. In the upper portion of the left movable bracket 16, there is formed a mounting surface 48 parallel to the rectangular groove 46, so that the corresponding end of the movable guide 18 is fixed to the mounting surface 48. Further, the bottom portion of the movable bracket 16 has a rectangular groove 50 which is formed across the groove 46 and so as to extend along the X axis. A clamp lever 52 is received within a portion of the groove 50 above the groove 46. The clamp lever 52 is supported pivotally about a pin 54 which extends along the Y axis. The clamp lever 52 has an operating portion 56 at its one end, which engages one end of a spring 60. This spring 60 is accommodated in a round hole 58 which opens in the mounting surface 48 at its one end and communicates with the rectangular groove 50. With a biasing force of the spring 60, a friction surface 60 of the clamp lever 52 is normally held in pressed contact with the top surface of the support plate 10, whereby the movable bracket 16 is normally held fixed to the support plate, i.e., fixed in position in the Y-axis direction. Since the friction surface 62 is located near the pin 54, the biasing force exerted on the operating portion of the clamp lever 52 is boosted at the friction surface 62 with a predetermined advantage according to the principle of a lever, whereby the friction surface 62 is forced against the support plate 10 with a boosted force. The other end of the spring 60 bears on the lower surface of the movable guide 18 fixed to the mounting surface 48.

Figure 7:
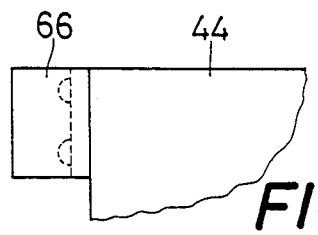
FIG. 7 is an elevational view of one end of a guide plate used in a conveyer system of the apparatus.
Figure 8:
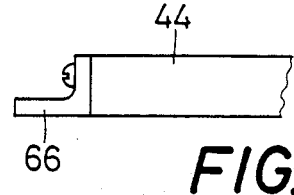
FIG. 8 is a plan view of the guide plate which is partially shown in FIG. 7.

In the side surface of the movable bracket 16, there is formed an engagement groove 64 which extends in the vertical direction, i.e., along a Z axis perpendicular to the X and Y axes, and which terminates into the groove 50 discussed above. This engagement groove 64 is adapted to receive an engagement member 66 fixed at the end of the guide plate 44 of the feed-in device 34, as also indicated in FIGS. 7 and 8. The engagement member 66 has an L-shaped configuration as seen in FIGS. 2 and 8, and the thickness of its free end is determined with respect to the engagement groove 64 so that that the engagement member 66 fits the groove 64 with only a slight clearance in the Y-axis direction, whereby the movable bracket 16 is fixed in place by the engagement member 66 along the Y axis. The engagement member 66 serves as a second connecting member which is engageable with the engagement groove 64 in order to connect the guide plate 44 to the movable bracket 16 and therefore to the movable guide 18. On the other hand, a portion of the movable bracket 16 in which the engagement groove 64 is formed serves as a first connecting member which is engageable with the second connecting member 66.

Figure 6:
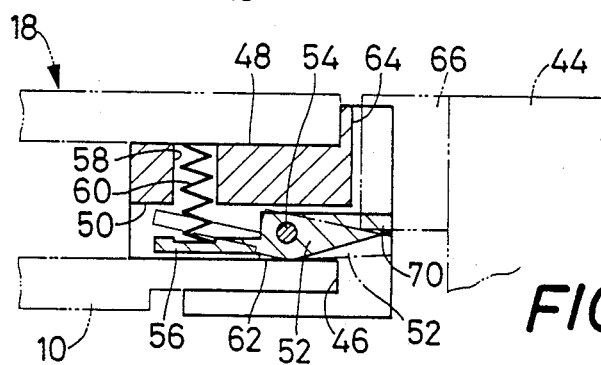
FIG. 6 is a cross sectional view taken along line VI—VI of FIG. 5.

The other end portion 70 of the clamp lever 52 remote from the operating portion 56 at said one end projects into the engagement groove 64, so that when the engagement member 66 is inserted into the engagement groove 64, the clamp lever 52 is pivoted by the engagement member 66 against the biasing force of the biasing spring 60 as shown in broken line in FIG. 6. As a result, the movable bracket 16 and the movable guide 18 are allowed to move relative to the support plate 10 in the Y-axis direction. Thus, the clamp lever 52, spring 60, etc. constitute a clamp mechanism for clamping the Y-axis positioning member (16, 18) to the support plate 10, while the engagement member 66 constitutes an unclamping member for bringing the clamp mechanism into its unclamp position from its clamp position. As is apparent from the above description, the engagement member 66 serves not only as the second connecting member, but also as the unclamping member for the clamp mechanism.

Figure 4:
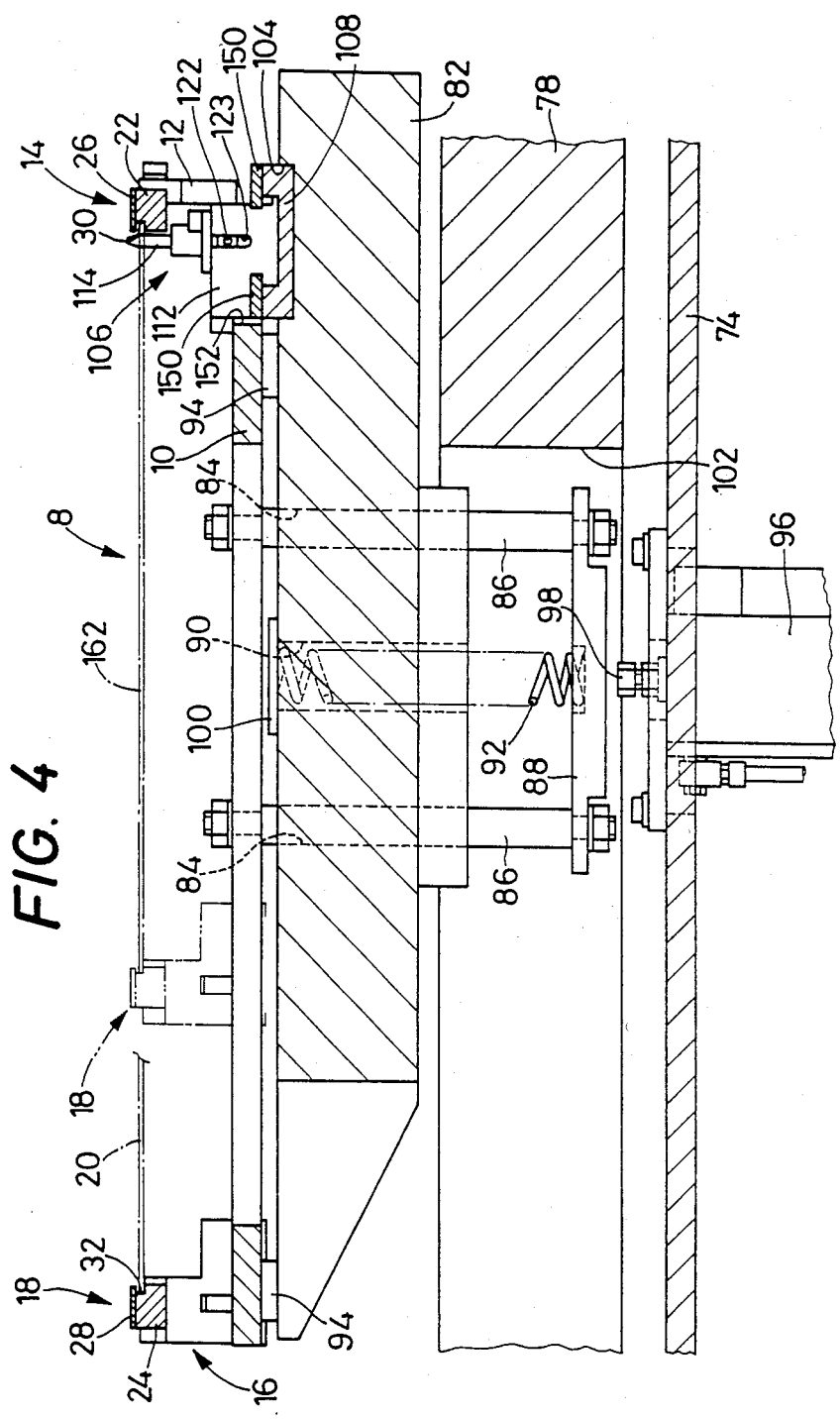
FIG. 4 is an elevational view in cross section taken along line IV—IV of FIG. 2.

The support plate 10 which supports the stationary and movable brackets 12, 12, 16, 16 and the stationary and movable guides 14, 18, is mounted on an NC (numerically controlled) table 72 which is moved in the X-Y plane. Described in greater detail referring to a plan view of FIG. 9 and a front elevational view of FIG. 10, the NC table 72 is a well known X-Y table which includes an X-axis slide 78 which is linearly moved along the X axis by a drive motor 76 attached to a base 74, and a Y-axis slide 82 which rests on the X-axis slide 78 and is linearly moved along the Y axis by a drive motor 80. The support plate 10 is supported on the Y-axis slide 82 such that the plate 10 is not movable relative to the Y-axis slide 80 in the X-and Y-axis directions, but is movable relative to the Y-axis slide 80 in the vertical direction, that is, along the Z axis normal to the X and Y axes. Referring back to FIG. 4, the Y-axis slide 82 has a pair of holes 84, 84 formed in the Z-axis direction through its thickness. Through these holes 86, 86 are inserted a corresponding pair of rods 86, 86 such that the rods 86, 86 are slidable relative to the Y-axis slide 82. The support plate 10 is fixed to the top ends of the rods 86, 86 which protrude above the upper surface of the Y-axis slide 82.

Figure 9:
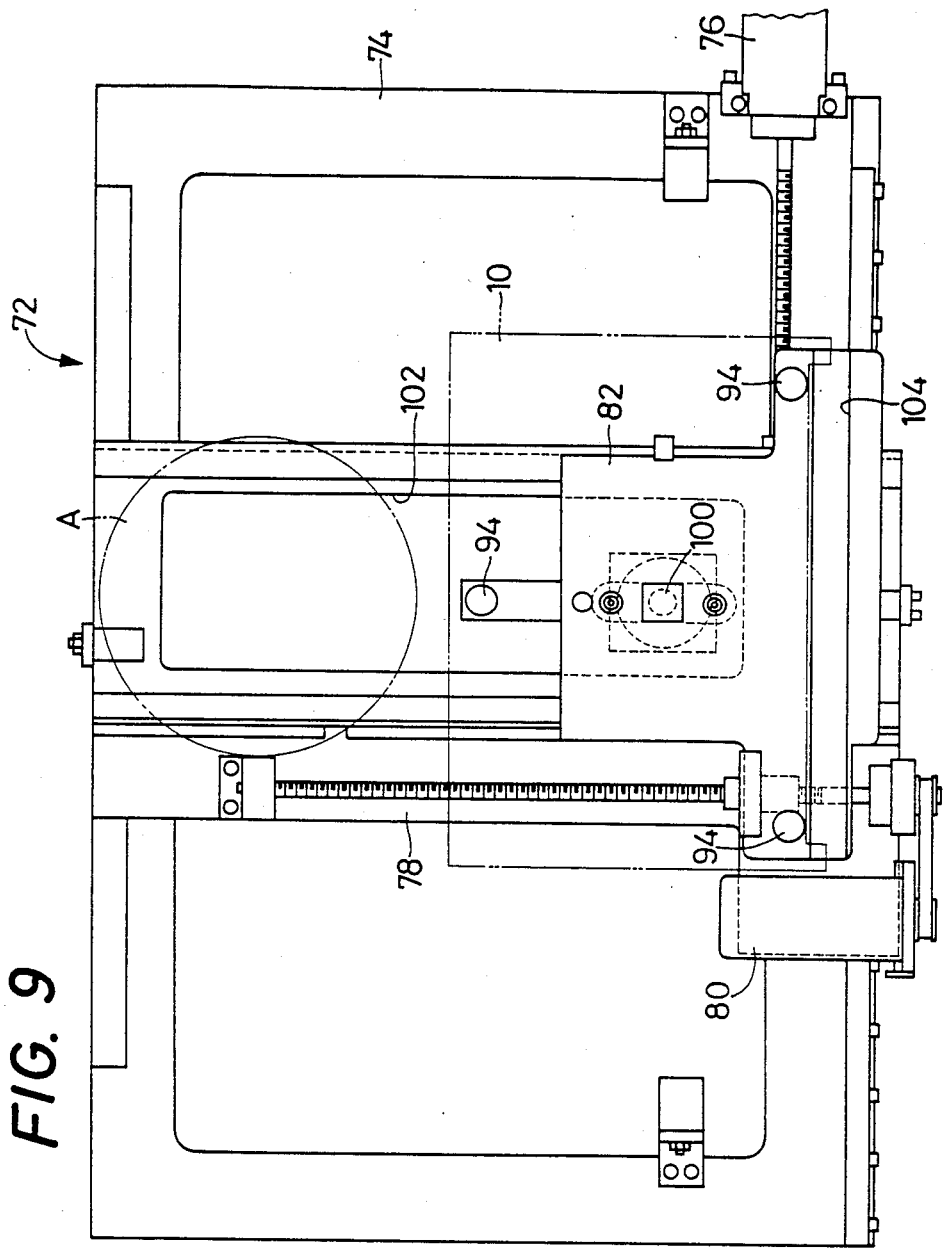
FIG. 9 is a plan view of an NC table, as taken with a support plate removed from an NC table of the substrate positioning device.
Figure 10:
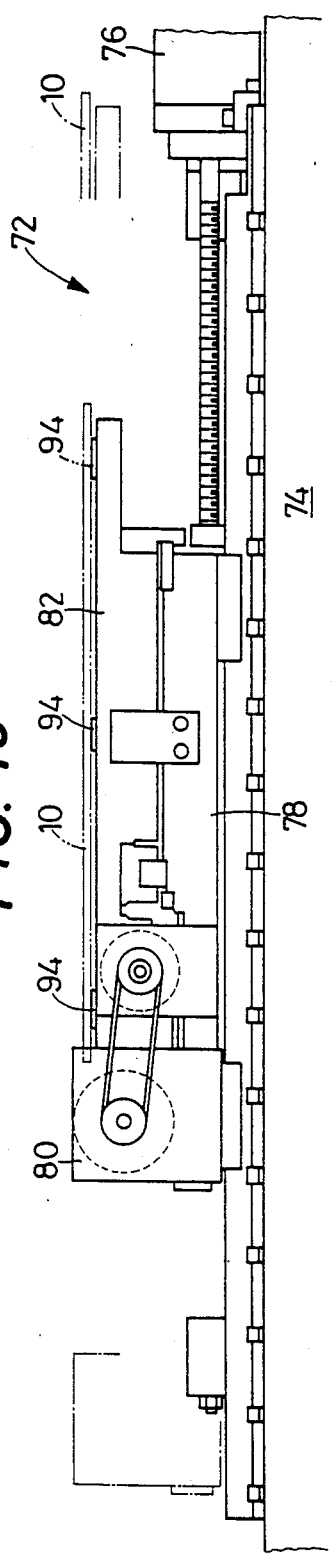
FIG. 10 is a front elevational view of the NC table of FIG. 9.

The lower ends of the rods 86, 86 which protrude below the bottom surface of the Y-axis slide 82 are connected to each other by a connecting bar 88, which is held is biased contact with one end of a spring 92 received in a hole 90 formed in the Y-axis slide 82. With the connecting bar 88 biased downwardly by the spring 92, the support plate 10 is normally held in its lower position in which the bottom surface of the plate 10 abuts on stopper bosses 94 formed on the Y-axis slide 82. Meanwhile, a cylinder 96 is attached to the base 74. A piston rod of the cylinder 96 has an adjusting bolt 98 fixed thereto, so that the adjusting bolt 98 is abutable on the bottom of the connecting bar 88 to elevate the support plate 10 to its upper position which is spaced a predetermined distance from the upper surface of the Y-axis slide 82. When the support plate 10 is placed in its upper position, the cutouts 30, 32 in the movable and stationary guides 14, 18 are substantially aligned with the upper surfaces of the conveyer belts 38, 40 of the feed-in and feed-out devices 34, 36 previously described. In this condition, the substrate 20 can be transferred from the feed-in device 34, and toward the feed-out device 36. When the support plate 10 is placed in its lower position, the support plate 10 and the substrate 20 supported on the plate 10 are located below the level of the feed-in and feed-out devices 34, 36, so that the support plate 10 and the substrate 20 can be moved along the X and Y axes by and together with the Y-axis slide 82, without an interference with the feed-in and feed-out devices 34, 36. Hence, it is possible to position the substrate 20 at desired positions for drilling holes in the substrate 20 or placing electronic component chips at those desired positions. Indicated at A in FIG. 9, is the predetermined substrate-positioning area in which such drilling or chip placing operations are performed. The upper opening of the hole 90 in the Y-axis slide 82 is closed by a covering member 100 on which the upper end of the spring 92 bears. The X-axis slide 78 is formed with a cutout 102 which extends in the Y-axis direction, so as to permit the lower portions of the rods 86, 86 below the Y-axis slide 82, the connecting bar 88 and other members to be moved with the Y-axis slide 82 in the Y-axis direction.

As is apparent from the foregoing description, the NC table 72 constitutes first moving means for moving the support plate 10 along the X and Y axes (in the X-Y plane), and the spring 92, cylinder 96 and the related components constitute second moving means for moving the support plate 10 between its upper or aligned position in which the movable brackets 16 and the movable guide 18 are aligned with the respective engagement members 66 of the guide plates 44 of the feed-in and feed-out devices, and its lower or unaligned position (of FIG. 1) in which the movable brackets 16 and the movable guide 18 are spaced from the engagement members 66 along the Z axis, and in which the substrate 20 may be positioned by the NC table 72 in the predetermined are in the X-Y plane.

In the front portion of the Y-axis slide 82, there is formed a rectangular groove 104 in the X-axis direction. At the right-hand side end portion of this rectangular groove 104 is fixedly disposed a primary positioning member 106. In the remaining portion of the groove 104, there is fixed a guide rail 108 of a U-shape in transverse cross section such that the opening of the U-shape is on the upper side, as clearly shown in FIG. 4. The guide rail 108 slidably supports a secondary positioning member 110 so that the latter is movable in the former in the X-axis direction. These primary and secondary positioning members 106, 110 serve to accurately position the substrate 20 in the X-Y plane, after the substrate 20 has been roughly positioned along the Y-axis with the stationary and movable guides 14, 18.

Figure 12:
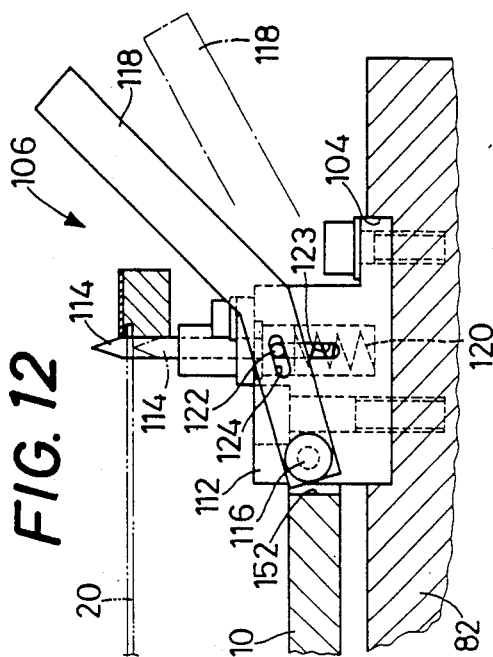
FIG. 12 is a cross sectional view of the primary positioning member mounted on a Y-axis slide of the NC table.
Figure 11:
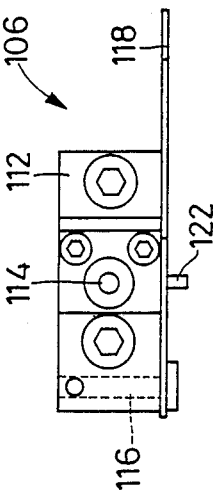
FIG. 11 is a plan view of a primary positioning member of the substrate positioning device.

As illustrated in FIGS. 11 and 12, the primary positioning member 106 comprises a positioning pin 114 which projects upward from a block 112 fixed in the rectangular groove 104, and further comprises a dog plate 118 which is supported pivotally about a pin 116 fixed to a side surface of the block 112. The positioning pin 114 is normally held by a spring 120 in its upper position of FIG. 12. In this upper position, the tip of the positioning pin 114 is lower than the upper surface of the substrate 20 which is supported by the stationary and movable guides 14, 18 while the support plate 10 is in its upper position. When the support plate 10 is lowered to its lower position, the positioning pin 114 is inserted through a positioning hole formed in the substrate 20 if the substrate 20 transferred from the feed-in device 34 is correctly positioned. However, if the substrate 20 is not correctly positioned, the positioning pin 114 is pushed down by the substrate 20 into the block 112 against the biasing action of the spring 120, as indicated in broken line in FIG. 12, when the support plate 10 is lowered to its lower position.

The positioning pin 114 is formed with a projection 122 at its lower portion. This projection 122 extends out of the block 112 through a cutout 123 formed in the block 112, and engages an elongate hole 124 formed in an intermediate portion of the dog plate 118. The cutout 123 formed in the block 112 is dimensioned so that the projection 122 is movable in the vertical direction when the pin 114 is moved. When the pin 114 is pushed down by the substrate 20 into the block 112 due to misalignment of the positioning hole in the substrate 20 with the pin 114, the dog plate 118 is pivoted about the pin 116 as the projection 122 is lowered. This pivotal movement of the dog plate 118 is used to activate a limit switch (not shown) which generates a signal to stop the operation of the positioning apparatus due to misalignment of the substrate 20.

Figure 13:
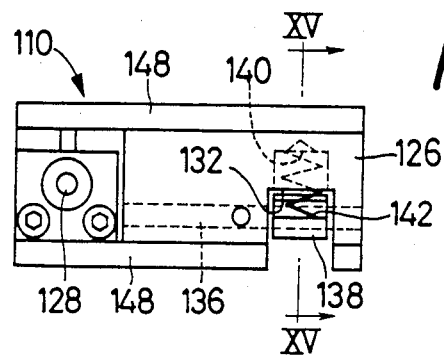
FIG. 13 is a plan view of a secondary positioning member of the positioning device.
Figure 14:
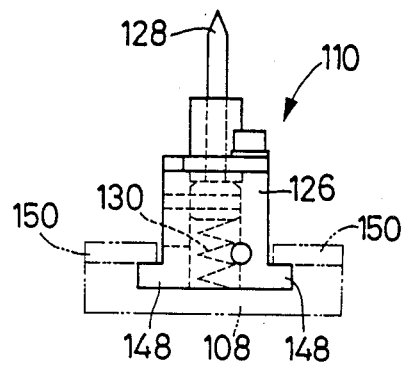
FIG. 14 is a left side elevational view of the secondary positioning member of FIG. 13.
Figure 15:
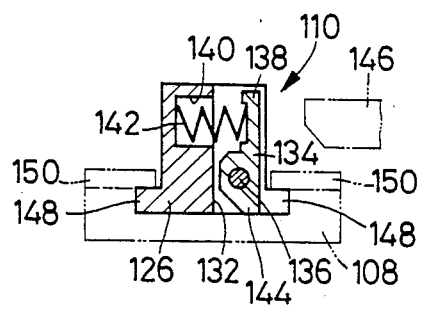
FIG. 15 is an elevational view in cross section taken along line XV—XV of FIG. 13.

As depicted in FIGS. 13 through 15, the secondary positioning member 110 comprises a positioning pin 128 protruding above a block 126 which slidably fits the guide rail 108. This positioning pin 128 is normally held by a spring 130 in its upper position. Like the upper position of the positioning pin 114 of the primary positioning member 106, the upper position of the positioning pin 128 is determined such that the tip of the positioning pin 128 is lower than the upper surface of the substrate 20 supported by the support plate 10 in its upper position. When the support plate 10 is lowered to its lower position, the positioning pin 128 is inserted through another positioning hole formed in the substrate 20, thus cooperating with the positioning pin 114 of the primary positioning member 106 to position the substrate 20 with high precision. However, if the substrate 20 is not correctly positioned, the positioning pin 128 is pushed down by the substrate 20 into the block 126 against the biasing action of the spring 130.

In the front portion of the block 126, i.e., on the right side of the block 126 as viewed in FIG. 15, there is formed a vertical groove 132 in which is supported a clamp lever 134 pivotally about a pin 136. A hole 140 is formed in the block 126 such that the hole 140 opens in the groove 132. One end portion 138 of the clamp lever 134 is held in engagement with one end of a spring 142 the other end of which bears on the bottom of the hole 140. With the above one end portion 138 biased by the spring 142, the other end portion 144 of the clamp lever 134 is normally held in pressed contact with the guide rail 108. In this arrangement, the secondary positioning member 110 is normally clamped to the guide rail 108. As indicated in FIG. 15, an unclamping member 146 is supported by a stationary member such as the base 74, such that the unclamping member 146 is movable in the Y-axis direction by a cylinder or other means, but not in the X-axis direction. The unclamping member 146 is adapted so as to abut on the previously-indicated one end portion 138 of the clamp lever 134 when the unclamping member 146 is advanced by the cylinder 147. As a result, the clamp lever 134 is pivoted by the unclamping member 146 against the biasing force of the spring 142, whereby the secondary positioning member 110 is unclamped with respect to the guide rail 108, and to the support plate 10. Thus, the secondary positioning member 110 is allowed to move in the X-axis direction. The free end of the unclamping lever 146 has substantially the same width as the groove 132, so that the free end may fit the groove 132 in the block 126. In this manner, therefore, the secondary positioning member 110 is held fixed in the X-axis direction by the unclamping lever 146. The block 126 has, at its bottom portion, a pair of flanges 148, 148 which extend in the opposite directions along the Y axis. In the meantime, a pair of retainer plates 150, 150 are attached to the upper surfaces of the guide rail 108. These retainer plates 150, 150 cooperate with the guide rail 108 to define a pair of guide grooves in which the flanges 148, 148 of the block 126 are slidably received to guide the block 126 along the X axis. In this arrangement, the block 126 is prevented from tilting when it is clamped to the guide rail 108 by the clamp lever 134. As indicated in FIG. 2, the support plate 10 has a cutout 152 in its front portion so as to accommodate a portion of the guide rail 108 on the Y-axis slide 82, and portions of the primary and secondary positioning members 106, 110, so that the previously described positioning pins 114, 128 are located at the rear of the stationary guide 14.

Each of the feed-in and feed-out devices 34, 36 is provided with plurality of adjusting screws 156 and a plurality of nuts 155 (only one screw 156 and the corresponding nut 155 for the feed-in device 34 are shown in FIG. 2). All the adjusting screws 156 for the feed-in and feed-out devices 34, 36 are operatively connected to each other by sprockets 158 and a chain 160. When one of the adjusting screws 156 is operated with a handwheel 157 connected thereto, the movable guide plates 44 and the corresponding conveyer belt 40 are moved toward or away from the stationary guide plate 42 and the corresponding conveyer belt 38. Thus, it is possible to simultaneously change the distance between the guide plates 42, 44 of the feed-in device 34, and that of the feed-out device 36, so as to meet the specific Y-axis dimension of the substrate 20 to be handled. As is understood from the above, the nuts 155, adjusting screws 156, handwheel 157, sprockets 158, chain 160 and the related components cooperate to constitute distance-changing means for changing the distances between the guide plates 42, 44 of the conveyer system. It will be obvious that the adjusting screws 156 may be automatically operated by a drive motor or other suitable drive means.

In the positioning apparatus which is constructed as described hitherto, the stationary and movable guides 14, 18 on the support plate 10 are put into alignment with the corresponding ends of the guide plates 42, 44 of the feed-in and feed-out devices 34, 36, when the support plate 10 is moved by the cylinder 96 to its upper aligned position at which the substrate 20 is received by and removed from the substrate positioning device 8. As a result, the engagement grooves 64 formed in the movable brckets 16 at the opposite ends of the movable guide 18 engage the corresponding engagement members 66 extending from the corresponding ends of the movable guide plates 44. In this condition, the movable brackets 16 and the movable guide plates 44 are connected to each other such that they are not movable relative to each other in the Y-axis direction. Further, the clamp levers 52 are pivoted by the engagement members 66 as the unclamping members, and are thus brought into their unclamp position, whereby the movable brackets 16 are unclamped from the support plate 10 and are movable in the Y-axis direction relative to the support plate 10.

When the movable guide plates 44 are moved relative to the stationary guide plates 42 by operating the adjusting screws 156 in the above-indicated conditions, the movable guide 18 is also moved relative to the stationary guide 14 because of the engagement between the engagement members 66 and the movable brackets 16 to which the movable guide 18 is fixed. For example, if a substrate 162 (FIGS. 2 and 4) smaller in size than the substrate 20 is to be handled by the present apparatus, the movable guide plates 44 are moved toward the stationary guide plates 42, as indicated in two-dot chain line in FIGS. 2 and 4, whereby the movable guide 18 of the positioning device 8 is moved toward the stationary guide 14, so as to reduce the distance between the two guides 14, 18 to a value corresponding to the Y-axis dimension of the small substrate 162. Thus, the distance between the stationary and movable guides 14, 18, as well as the distance between the stationary and movable guides 14, 18, can be readily and accurately adjusted to a desired value that suits the Y-axis dimension of any substrates of different sizes. Since the present embodiment is adapted such that both of the movable brackets 16 at both ends of the movable guide 18 are connected to the guide plates 44 and moved by the same amount, the movable guide 18 can be smoothly moved relative to the stationary guide 14, while keeping the parallel relation with respect to the stationary guide 14. From the foregoing description, it will be understood that the support plate 10 is moved to its upper position for changing the distance between the stationary and movable guides 14, 18 upon changeover of the substrate from one size to another, as well as for loading and unloading of the substrate to and from the positioning device 8.

Subsequently, the piston rod of the cylinder 96 is retracted to permit the support plate 10 to be lowered to its lower position under the biasing action of the spring 92. As a result, the engagement of the engagement grooves 64, 64 with the engagement members 66 is released, whereby the clamp levers 52 are pivoted to clamp the movable brackets 16, 16 to the support plate 10. In this connection it is noted that the guide plates 44 are fixed in position through engagement thereof with the adjusting screws 156.

In the present embodiment, the primary and secondary positioning members 106, 110 are provided to accurately position the substrate which has been roughly positioned by the stationary and movable guides 14, 18. While the primary positioning member 106 is held fixed in position irrespective of the size of the substrate, the secondary positioning member 110 can be readily and accurately positioned at a suitable location along the X axis, which location is determined depending upon the X-axis dimension of the substrate. To adjust the position of the secondary position member 110, the X-axis slide 78 is first moved along the X axis so that the groove 132 in the secondary positioning member 110 is aligned with the unclamping member 146. Then, the unclamping member 146 is advanced into the groove 132, for pivoting the clamp lever 134 to unclamp the secondary positioning member 110 with respect to the guide rail 108, and for holding the secondary positioning member fixed in position in the X-axis direction. In this condition, the X-axis slide 78 is moved along the X axis to move the secondary positioning member 110 relative to the guide rail 108, i.e., relative to the support plate 10, for example, to the position indicated in two-dot chain line in FIG. 2, which corresponds to the X-axis dimension of the small substrate 162 previously indicated. Then, the unclamping member 146 is retracted for disengagement thereof from the groove 132 in the block 126, whereby the secondary positioning member 110 is again clamped to the guide rail 108 by the clamp lever 134. Thus, the secondary positioning member 110 is fixed in position in the X-axis direction, with respect to the support plate 10.

According to the illustrated embodiment of the substrate conveying and positioning apparatus of the invention, the distance between the guide plates 42, 44 of the feed-in device 34, and that of the feed-out device 36, can be simultaneously changed. In addition, the distance between the stationary and movable guides 14, 18 of the positioning device 8 can be changed automatically when the distance between the guide plates 42, 44 of the conveyer system is changed. Accordingly, the time and efforts needed for changing these distances can be significantly reduced, as compared with the time and efforts conventionally required for individually changing such distances. In particular, the present embodiment is advantageous in that the movable guide 18 is automatically connected to the movable guide plates 44 through automatic engagement of the engagement grooves 64 of the movable brackets 16 with the respective engagement members 66 provided at the ends of the movable guide plates 44 when the support plate 10 is moved to the upper position (aligned position). Stated differently, the present embodiment does not require the operator to manually connect the movable guide plates 44 of the conveyer system to the movable guide 18 of the positioning device 8. Moreover, the apparatus as a whole can be simplified in construction and manufactured at a reduced cost, because the positioning device 8 does not require a screw-and-nut arrangement or other means which is exclusively designed for changing the distance between the stationary and movable guides 14, 18.

Further, the movable guide 18 and the secondary positioning member 110, which are movable relative to the support plate 10 according to the size of the substrate, can be clamped by the clamp levers 52 and the clamp lever 134, respectively, such that they are normally fixed in position in the Y-axis and X-axis directions, respectively. Therefore, the positions of the movable guide 18 and the secondary positioning member 110 relative to the support plate 10 will not be changed during movements of the NC table 72 for positioning the substrate in drilling holes therein or placing chips thereon. This means improved accuracy of positioning of the substrate. Since the clamp levers 52, 134 are automatically operated by the engagement members 66, 66 and the unclamping member 146 and placed into their unclamp position prior to changing the positions of the movable guide 18 and the secondary positioning member 110, it is not necessary to manually unclamp the movable brackets 16, 16 and the secondary positioning member 110. Namely, there is no possibility that these members 16, 16, 110 are left in their clamp position when they are moved relative to the support plate 10. Further, the unclamping members 66, 66 serve as the second connecting member for connecting the movable guide plates 44 to the movable guide 18, as previously indicated. In the meantime, the unclamping member 146 serves also as an engagement member engageable with the secondary positioning member 110 for holding the positioning member 110 fixed in position in the X-axis direction when a relative X-axis position between the positioning member 110 and the support plate 10 is moved. Hence, the construction of the apparatus is further simplified.

In connection with the constructional simplicity of the instant apparatus, it is further noted that the second moving means comprising the cylinder 96 and the spring 92 for operating the support plate 10 between its upper and lower positions is not provided exclusively for engagement of the engagement grooves 64, 64 with the engagement members 66, 66. In other words, this drive source is absolutely necessary for elevating and lowering the support plate 10 for engagement and disengagement of the positioning pins 114, 128 with respect to the positioning holes in the substrate, when the substrate is supplied from the feed-in device 34 to the support plate 10 or when the substrate on the support plate 10 is transferred to the feed-out device 36. In this sense, the engagement and disengagement of the engagement grooves 64 with respect to the engagement members 66, 66 do not require an exclusive driving device, which would complicate the apparatus as a whole.

While the present invention has been described in detail in its preferred embodiment referring to the drawings, it is to be understood that the invention may be otherwise embodied.

Figure 16:
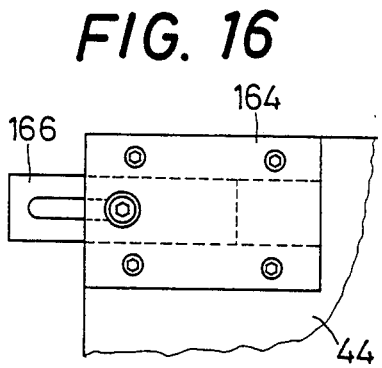
FIG. 16 is an elevational view of one end of a guide plate of the conveyer system according to a modified embodiment of the invention.
Figure 17:
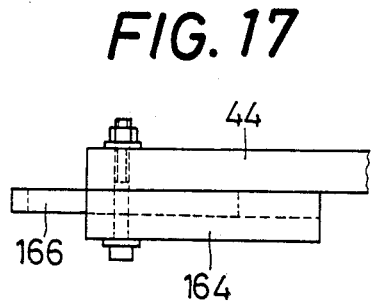
FIG. 17 is a plan view of the guide plate of FIG. 16.

For example, while the engagement members 66 are fixed to the ends of the movable guide plates 44 are adapted to be engageable with the engagement grooves 64 also when the support plate 10 is moved to its upper position for loading or unloading the substrate, these engagement members 66 may be replaced by engagement members which are disposed on the movable guides 44 such that they are slidably movable or pivotable for engagement with the engagement grooves 64 only when the movable guide plates 44 and the movable guide 18 are moved upon changeover of the substrate from one size to another. These engagement members are operated either automatically, or manually by the operator. An example of such an engagement member is indicated at 166 in FIGS. 16 and 17. This engagement member 166 is slidably supported on the guide plate 44 by means of a guide 164, so that the engagement member 166 is slidable between its advanced position shown in the figures, and its retracted position.

Although the conveyer system of the illustrated embodiment comprises the feed-in device 34 and the feed-out device 36 disposed on the opposite sides of the substrate positioning device 8, the concept of the present invention may be embodied as an apparatus wherein a conveyer system is disposed on only one side of the positioning device 8, for loading and/or unloading of the substrate. In this case, only the corresponding one of the two movable brackets 16, 16 is connected to the guide plate (side frame) of the conveyer system and the movable guide 18 is moved with the guide plate. Therefore, it is recommended that the movable guide of the positioning device 8 be slidably supported at one of its opposite ends which is located on the side of the conveyer system, or that the movable guide be supported via a bearing device to reduce a friction resistance with respect to the support plate 10. Further, the first and second connecting members, the clamp mechanism, and the unclamping members may be adapted so that the movable guide 18 may be connected to the movable guide plate or side frame of the conveyer system by moving the support plate 10 in the X-axis direction.

While the positioning device 8 of the illustrated apparatus is loaded and unloaded by means of the feed-in and feed-out devices 34, 36, in combination with separate loading and unload devices equipped with a pusher and a puller for transferring the substrate to and from the positioning device 8, such loading pusher and/or unloading puller may be built in the feed-in and feed-out devices 34, 36, respectively. Although the loading and unloading of the substrate are accomplished by sliding movements of the substrate by means of the loading pusher and unloading puller, it is possible that the supply and removal of the substrate are done by raising and lowering the substrate with gripper jaws. In this instance, it is not necessary that the holder members for supporting the substrate on the support plate 10 have the function of guiding the substrate in the X-axis direction, like the substrate holder members 14, 18 used in the illustrated embodiment. Instead, the holder members are required merely to position the substrate in the Y axis direction by engagement thereof with the two sides of the substrate parallel to the X axis, before the substrate is held by the holder members.

In the illustrated embodiment, the engagement members 66, 66 serve not only as the second connecting member engageable with the engagement grooves 64, 64 of the second connecting member 16, 16 for holding the movable guide 18 at a fixed Y-axis position, but also as the unclamping member for bringing the clamp levers 52 into their unclamp position. However, it is possible that the second connecting member and the unclamping member are provided as separate members. Similarly, the unclamping member 146 may be replaced by two separate members which serve, respectively, as the engagement member for holding the secondary positioning member 110 at a fixed X-axis position, and as the unclamping member for bringing the clamp lever 134 to its unclamp position.

As previously described, upon movement of the support plate 10 to its upper aligned position, the engagement grooves 64, 64 of the movable brackets 16, 16 are automatically brought into engagement with the engagement members 66, 66 while the clamp lever 52 is automatically brought into its unclamp position. However, the connecting device and the clamp mechanism may be modified so that the movable guide 18 and the guide plates 44 may be connected to each other and/or the clamp mechanism may be operated, by the operator.

Although the illustrated embodiment uses the clamp levers 52, 134 for clamping the movable brackets 16, 16 and the secondary positioning member 110, it is possible to use other clamping means such as air cylinders. Further, such clamping means may be eliminated, if the friction force between the movable brackets 16, 16 and the support plate 10, or between the secondary positioning member 110 and the guide rail 108, is so large that the brackets 16, 16 or the secondary positioning member are (is) not slidably movable relative to the support plate 10 or the guide rail 108.

While the illustrated embodiment is adapted to accurately position the substrate by both of the primary and secondary positioning members 106, 110 and to change the X-axis position of the secondary positioning member 110 to suit the size of the substrate, it is possible that the secondary positioning member is disposed near and in fixed relation with the right-hand side movable bracket 16 (in FIG. 2) so that the secondary positioning member may be moved in the Y-axis direction together with the movable brackets 16, that is, the Y-axis position of the secondary positioning member may be changed simultaneously when the position of the movable guide 18 is changed. Further, in the case where the Y-axis positioning of the substrate by the stationary and movable guides 14, 18 is sufficiently high, it is possible that the X-axis position of the substrate is established by using only one of the primary and secondary positioning members (X-axis positioning member).

Although the primary and secondary positioning members 106, 110 of the illustrated embodiment are disposed on the Y-axis slide 82 and their positioning pins 114, 128 are inserted into the positioning holes in the substrate to position the substrate in the X-axis direction as well as in the Y-axis direction, it is possible that the X-axis positioning of the substrate is effected by other suitable arrangements such as an X-axis positioning member which is adapted to abut on the side of the substrate parallel to the Y axis. Further, the positioning members 106, 110 may be disposed on the support plate 10 or on the movable and stationary guides 14, 18, if the positioning pins 114, 128 are operated between their upper and lower positions by suitable cylinders, or if the substrate is placed on the support plate 10 after the substrate is once positioned above the support plate 10.

Although the unclamping member 146 of the illustrated embodiment is advanced in the Y-axis direction for engagement thereof with the groove 132 of the secondary positioning member 110, it is possible that the unclamping member 146 may be fixed in the Y-axis direction as well as in the X-axis direction. In this case, the engagement of the unclamping member 146 with the groove 132 is achieved by moving the Y-axis slide 82 (support plate 10) and the secondary positioning member 110 in the Y-axis direction.

It will be obvious that the present invention may be embodied with various other changes, modifications and improvements which may occur to those skilled in the art, without departing from the spirit of the invention.

What is claimed is:

1. An apparatus for conveying and positioning a circuit substrate of a printed-wiring board, comprising:

a conveyer system including a pair of parallel side frames extending along an X axis and spaced apart from each other along a Y axis perpendicular to said X axis, at least one of which is movable relative to the other along said Y axis, distance-changing means for changing a distance between said pair of side frames by moving said at least one movable side frame along said Y axis, and conveyer means for transferring said substrate along said side frames;

a substrate positioning device including a support member, a pair of parallel spaced-apart holder members which are disposed on said support member and at least one of which is movable relative to the other along said Y axis so that said holder members are engageable with opposite sides of said substrate parallel to said X axis to thereby position and hold the substrate in the Y-axis direction, and first moving means for moving said support member in an X-Y plane including said X and Y axes, so as to position said substrate at desired positions within a predetermined substrate-positioning area in said X-Y plane;

second moving means for moving said support member between an aligned position thereof in which said holder members are aligned respectively with said side frames of said conveyer system in said Y-axis direction and an unaligned position in which said holder members are spaced from said side frames and in which said substrate is positioned in said substrate positioning area; and a connecting device for connecting said at least one movable holder member and said at least one movable side frame when said support member is placed in said aligned position, a distance between said holder members in said Y-axis direction being changed by said distance-changing means when said distance between said side frames is changed while said at least one holder member and at least one side frame are connected by said connecting device.

2. An apparatus according to claim 1, wherein said conveyor system comprises a feed-in device and a feed-out device which are disposed on opposite sides of said substrate positioning device, said connecting device comprising a first connector for connecting an end of said feed-in device and corresponding one of opposite ends of said at least one movable holder member, and a second connector for connecting an end of said feed-out device and the other end of said at least one movable holder member.

3. An apparatus according to claim 1, wherein said connection device comprises a first connecting member provided at one end of said at least one movable holder member adjacent to said at least one movable side frame, and a second connecting member provided at one end of said at least one movable side frame corresponding to said one end of said at least one movable holder member, said first and second connecting members being engageable with each other when said support member is moved to said aligned position by said second moving means.

4. An apparatus according to claim 3, further comprising:

a clamp mechanism associated with said first connecting member and operable between a clamp position in which said at least one movable holder member is clamped to said support member, and an unclamp position in which said at least one movable holder member is unclamped, said clamp mechanism being normally placed in said clamp position; and an unclamping member provided at said one end of said at least one movable side frame, and engageable with said clamp mechanism to bring the clamp mechanism into said unclamp position when said support member is moved to said aligned position by said second moving means.

5. An apparatus according to claim 4, wherein said second moving means moves said support member to said aligned position along a Z axis perpendicular to said X-Y plane.

6. An apparatus according to claim 5, wherein said second connecting member also serves as said unclamping member.

7. An apparatus according to claim 1, further comprising:

a clamp mechanism provided on said at least one movable holder member and operable between a clamp position in which said at least one movable holder member is clamped to said support member, and an unclamp position in which said at least one movable holder member is unclamped, said clamp mechanism being normally placed in said clamp position; and an unclamping member provided at one end of said at least one movable side frame corresponding to said one end of said at least one movable holder member, said unclamping member being engageable with said clamp mechanism to bring the clamp mechanism into said unclamp position when said support member is moved to said aligned position by said second moving means.

8. An apparatus according to claim 7, wherein said clamp mechanism comprises:

a clamp lever pivotally supported by said at least one movable holder member, and including an operating portion which is engageable with said support member in frictional contact with each other;

a spring for biasing said clamp lever to normally hold said operating portion in contact with said support member; and an actuator member which is operated through engagement thereof with said unclamping member, to pivot said clamp lever for moving said operating portion of the clamp lever away from said support member against a biasing force of said spring.

9. An apparatus according to claim 1, wherein said connecting device comprises a movable connecting member supported movably on one of said at least one movable side frame and said at least one movable holder member, and a fixed connecting member supported fixedly on the other of said at least one movable side frame and said at least one movable holder member, said movable and fixed connecting members engaging each other to connect said at least one movable side frame and said at least one movable holder member when said support member is placed in said aligned position.

10. An apparatus according to claim 1, wherein said substrate positioning device comprises X-axis positioning means which is engageable with said substrate to position the substrate in the X-axis direction.

11. An apparatus according to claim 10, wherein said X-axis positioning means is movable relative to said support member in said X-axis direction, and further comprising:

a first engagement member provided on said X-axis positioning means;

a second engagement member which is fixed in position in said X-axis direction; and means for moving said first and second engagement members relative to each other and for effecting engagement of said first and second engagement membrs with each other, to thereby hold said X-axis positioning means fixed in position in said X-axis direction, and permit a change in relative position between said X-axis positioning means and said support member in said X-axis direction when said support member is moved by said first moving means in said X-axis direction.

* * * * *